US012804979B2

(12) United States Patent
Shi et al.

(10) Patent No.: US 12,804,979 B2
(45) Date of Patent: Nov. 17, 2026

(54) SPLIT GATE POWER DEVICE AND METHOD OF MANUFACTURING THE SAME

(71) Applicant: CHONGQING ALPHA AND OMEGA SEMICONDUCTOR LIMITED, Chongqing (CN)

(72) Inventors: Liang Shi, Chongqing (CN); Li Yang, Chongqing (CN)

(73) Assignee: CHONGQING ALPHA AND OMEGA SEMICONDUCTOR LIMITED, Chongqing (CN)

( * ) Notice: Subject to any disclaimer, the term of this patent is extended or adjusted under 35 U.S.C. 154(b) by 422 days.

(21) Appl. No.: 18/418,366

(22) Filed: Jan. 22, 2024

(65) Prior Publication Data

US 2024/0162302 A1 May 16, 2024

Related U.S. Application Data

(63) Continuation of application No. PCT/CN2022/109827, filed on Aug. 3, 2022.

(30) Foreign Application Priority Data

Aug. 11, 2021 (CN) ......................... 202110920332.1

(51) Int. Cl.
*H10D 64/01* (2025.01)
*H10D 30/66* (2025.01)

(52) U.S. Cl.
CPC ........... *H10D 64/01* (2025.01); *H10D 30/668* (2025.01)

(58) Field of Classification Search
CPC .... H10D 30/00; H10D 30/01; H10D 30/0297; H10D 30/668; H10D 64/01;
(Continued)

(56) References Cited

U.S. PATENT DOCUMENTS

| | | | | |
|---|---|---|---|---|
| 8,431,457 B2 * | 4/2013 | Chang | .................. | H10D 30/665 257/334 |
| 8,889,532 B2 * | 11/2014 | Burke | .................. | H10D 12/038 438/270 |

(Continued)

FOREIGN PATENT DOCUMENTS

| | | |
|---|---|---|
| CN | 105448741 A | 3/2016 |
| CN | 105702736 A | 6/2016 |

(Continued)

OTHER PUBLICATIONS

International Search Report issued in corresponding International application No. PCT/CN2022/109827, mailed Oct. 26, 2022.

(Continued)

*Primary Examiner* — Leonard Chang
*Assistant Examiner* — Nimarta Kaur Chowdhary

(57) ABSTRACT

A split gate power device and a method of manufacturing the same are provided. The method includes: preparing an epitaxial layer; defining trenches; preparing a voltage support layer at a bottom of each of the trenches; preparing a source polysilicon; growing silicon oxide between polysilicon layers; preparing a gate polysilicon; performing ion implantation to form a body region and a source region; preparing contact holes and tungsten plugs; performing etching to form a circuit; and preparing a passivation layer.

6 Claims, 8 Drawing Sheets

(58) Field of Classification Search
CPC .. H10D 64/117; H10D 64/2527; H10D 62/00; H10D 62/052; H10P 14/24; H10P 14/6349
See application file for complete search history.

(56) References Cited

U.S. PATENT DOCUMENTS

| | | | | |
|---|---|---|---|---|
| 2011/0220990 | A1 | 9/2011 | Chang et al. | |
| 2019/0057970 | A1 * | 2/2019 | Sun | H10B 41/10 |
| 2021/0183659 | A1 * | 6/2021 | Lin | H10D 30/6892 |
| 2022/0045183 | A1 * | 2/2022 | Yang | H10D 64/117 |

FOREIGN PATENT DOCUMENTS

| | | | | | |
|---|---|---|---|---|---|
| CN | 111276394 | A | | 6/2020 | |
| CN | 113035840 | A | * | 6/2021 | H10P 30/22 |
| CN | 113644028 | A | | 11/2021 | |

OTHER PUBLICATIONS

Written Opinion of the International Search Authority in corresponding International application No. PCT/CN2022/109827, mailed Oct. 26, 2022.

* cited by examiner

SPLIT GATE POWER DEVICE AND METHOD OF MANUFACTURING THE SAME

TECHNICAL FIELD

The present disclosure relates to a field of manufacturing semiconductors, and in particular to a split gate power device and a method of manufacturing the split gate power device.

BACKGROUND

Due to importance of environmental protection in all fields of life and power devices are energy saving and power saving, the power devices are becoming more and more prominent in electronic power applications. In particular, a split gate power device has a low on-resistance, a high turn-on speed, and a low switching loss, and therefore, the split gate power device is favored by the market.

A conventional method for manufacturing the split gate power device includes following steps. Firstly, an epitaxial layer is growing on a silicon substrate. Subsequently, trenches are defined in the epitaxial layer. Further, an oxidation process is performed on a voltage support dielectric layer disposed at a bottom of each of the trenches. Next, source polysilicons are formed at middle-lower portions of the trenches. Subsequently, high-density plasma precipitation of silicon oxide is performed to form silicon oxide between polysilicon layers. Then, a gate polysilicon is formed. Next, a body region and a source region are prepared. Then, a dielectric layer is formed, and contact holes and tungsten plugs are prepared. Subsequently, circuit connection is formed. Lastly, a passivation layer is formed.

However, the above manufacturing method may cause following problems. While performing the oxidation process on the voltage support dielectric layer at the bottoms of the trenches, upper parts of the trenches are also oxidized, a linewidth of a gate region of the trenches is wide, such that the trench gate channels are easily affected by ion implantation of the contact via, and threshold voltage may be affected. Further, an extent of quantity of unit cells is reduced. Since high-density plasma precipitation of silicon oxide is performed to form the silicon oxide between polysilicon layers, plasma bombardment is generated, causing charge leakage. In addition, the above process may easily cause cavities in the silicon oxide, further reducing the extent of quantity of unit cells.

Therefore, the conventional method for manufacturing the split gate power device needs to be improved.

SUMMARY OF THE DISCLOSURE

To solve the above technical problem, the present disclosure provides a split gate power device and a method of manufacturing the split gate power device.

In a first aspect, the method of manufacturing the split gate power device includes following operations:

- preparing one or more epitaxial layers, including: depositing, by performing chemical vapor deposition, one or more epitaxial layers on a surface of a silicon substrate, where each of the one or more epitaxial layers is doped with trivalent elements or pentavalent elements;
- defining trenches;
- preparing a voltage dielectric support layer at a bottom of each of the trenches;
- preparing a source polysilicon;
- growing an inter-polysilicon-layered silicon oxide;

- preparing a gate polysilicon;
- performing ion implantation to form a body region and a source region;
- preparing contact holes and tungsten plugs;
- performing etching to form a circuit.
- preparing a passivation layer, including: depositing the passivation layer; etching the passivation layer by performing a lithography process; and performing an alloy annealing process, where the passivation layer includes silicon nitride or silicon dioxide.

In some embodiments, the operation of defining the trenches includes:

- depositing a first mask on an upper surface of the one or more epitaxial layers, where the first mask is photoresist or a multilayer structure of the photoresist combining with multi-layers of insulating masks, the photoresist is spin-coated by performing a photolithography process;
- defining a gate trench pattern and a source trench pattern on the first mask; where gate trenches to be formed from the gate trench pattern include a unit cell gate trench and a gate-interconnection trench; source trenches to be formed from the source trench pattern include a unit cell source trench and a source-interconnection trench; and
- forming, after the gate trench pattern and the source trench pattern being formed on the first mask, the gate trench pattern and the source trench pattern on the one or more epitaxial layers by performing dry etching.

Critical dimensions of interconnection trenches are greater than critical dimensions of the cell trenches.

In some embodiments, the operation of preparing the voltage dielectric support layer at the bottom of each of the trenches includes:

- removing, by performing wet etching, the first mask; performing thermal oxidation to round the gate trench pattern, and the source trench pattern and to repair damages caused by plasma; growing a layer of silicon oxide on a trench wall of each of the gate trench pattern, and the source trench pattern; processing the silicon oxide by performing wet etching;
- growing a pad layer by performing an oxidation process; growing a silicon nitride film on the pad layer by performing low-pressure chemical vapor deposition, where the silicon nitride film covers a trench surface of each of the gate trenches and the source trenches disposed on the entire surface of the one or more epitaxial layers;
- depositing polysilicon for oxidation, by performing low-pressure chemical vapor deposition, to cover the surface of the silicon nitride film and to fully fill an inside of each of the gate trenches and the source trenches;
- removing a portion of the polysilicon for oxidation, which is disposed on the surface of the silicon nitride film and at an upper portion of the inside of each of the gate trenches and the source trenches, by performing chemical mechanical grinding and plasma etching, enabling the rest portion of the polysilicon to be disposed at a lower portion and a middle portion of each of the gate trenches and the source trenches;
- depositing, by performing chemical vapor deposition, silicon oxide on the surface of the silicon nitride film and the inside of each of the gate trenches and the source trenches;
- dry etching the silicon oxide; due to the dry etching being non-directional, retaining a portion of the silicon oxide on a trench side surface of each of the gate trenches and the source trenches to serve as an isolation layer when the polysilicon is etched subsequently;

dry etching the polysilicon; due to the isolation layer, which is disposed on the trench side surface of each of the gate trenches and the source trenches, blocking the dry etching, retaining a portion of the polysilicon on a trench surface of the middle portion and a trench surface of the lower portion of each of the gate trenches and the source trenches;

converting, by performing thermal oxidation, any polysilicon that is retained after the dry etching into silicon oxide, where the silicon nitride film and the silicon oxide disposed at the lower portion of each of the gate trenches and the source trenches serve as the voltage support dielectric layer, where the surface of the one or more epitaxial layers and the trench surface of the upper portion and the trench surface of the middle portion of each of the gate trenches and the source trenches are not oxidized due to being covered by the silicon nitride film, and therefore, critical dimensions of the upper portion and the middle portion of each of the gate trenches and the source trenches are not widened as those in a conventional split gate power device;

removing the silicon nitride film by using hot phosphoric acid. Since the silicon nitride film disposed at the lower portion of each of the gate trenches and the source trenches is covered by the silicon oxide, only the silicon nitride film, which is disposed on the surface of the one or more epitaxial layers and at the upper portion of each of the gate trenches and the source trenches, is removed.

In some embodiments, the operation of preparing the source polysilicon includes:

forming, by performing chemical vapor deposition, the source polysilicon on the surface of the one or more epitaxial layers and in the inside of each of the gate trenches and the source trenches;

coating, by performing a photolithographic process, photoresist to form a second mask; defining a source-interconnection trench pattern on the second mask by performing the photolithography process through the second mask to expose the photoresist; dry etching the source polysilicon; and removing any residual second mask by using hot sulfuric acid.

In some embodiments, the operation of growing the inter-polysilicon-layered silicon oxide includes:

forming, by performing the thermal oxidation process, another layer of silicon oxide on the surface of the source polysilicon to serve as the inter-polysilicon-layered oxide layer.

In some embodiments, the operation of preparing the gate polysilicon includes:

forming, by performing chemical vapor deposition, the gate polysilicon to fill the inside of each of the gate trenches and the source trenches and to cover the surface of the one or more epitaxial layers;

removing, by performing chemical mechanical grinding, the gate polysilicon that is disposed on the surface of the one or more epitaxial layers and received in the source-interconnection trench, where only the gate polysilicon received in each of the gate trenches is retained, and the silicon oxide, which is disposed on a surface of the source polysilicon received in the source-interconnection trench, is exposed;

completely removing, by performing hydrofluoric-acid wet etching, the silicon oxide that is disposed on the surface of the source polysilicon received in the source-interconnection trench, where the source polysilicon received in the source-interconnection trench is exposed.

In some embodiments, the operation of performing ion implantation to form the body region and the source region includes:

implanting first impurities into the upper surface of the one or more epitaxial layers to obtain a body region; activating, by performing the thermal process, the first impurities in the body region, where the first impurities include the trivalent elements or the pentavalent elements;

implanting second impurities into an upper surface of the body region to obtain a source region, where the second impurities are the pentavalent elements or the trivalent elements; and obtaining the unit cell.

In some embodiments, the operation of preparing the contact holes and the tungsten plugs includes:

forming, by performing chemical vapor deposition, a silicon dioxide dielectric layer;

defining, by performing the photolithography process and using the photoresist, a contact hole pattern of the source region, a contact hole pattern of a source region trench, and a contact hole pattern of a gate-interconnection region; where the contact holes of the source region are located at the body region, the contact hole of the source region trench is located above the source-interconnection trench, and the contact hole of the gate-interconnection region is disposed above the gate trench;

forming the contact holes of the source region, the contact hole of the source region trench, and the contact hole of the gate-interconnection region by dry etching the silicon dioxide dielectric layer, the source region, the body region, and the source polysilicon;

doping, by performing ion-implantation, third impurities that are highly-concentrated to a bottom of the contact hole of the trench of the body region to obtain an ohmic contact region of the contact hole of the trench of the body region; activating, by performing rapid thermal annealing, the third impurities; where polarity of the third impurities is opposite to polarity of the first impurities;

depositing, by performing physical vapor deposition, metals and nitrides to serve as a protection layer of each contact hole; forming silicides by performing rapid thermal degradation, where the metals include one or more of titanium, cobalt, and tantalum; and depositing metal tungsten by performing a tungsten-bolt process; removing any metal tungsten, which is disposed outside the contact holes of the source region, the contact hole of the source region trench, and the contact hole of the gate-interconnection region, by performing dry etching; forming the tungsten plugs in the contact holes of the source region, the contact hole of the source region trench, and the contact hole of the gate-interconnection region.

In some embodiments, the operation of performing etching to form the circuit includes: depositing, by performing physical vapor deposition, an aluminum-copper compound on each of the tungsten plugs; and performing the photolithographic process and dry etching to form the circuit.

In a second aspect, the split gate power device obtained by performing the above method is provided.

According to the present disclosure, the following technical effects are achieved.

(1) The problem of the conventional split gate power device having an excessive linewidth in the gate trench region is avoided, the extent of quantity of unit cells is improved, consistency in threshold voltages of various unit cells is improved.

(2) The silicon oxide between polysilicon layers is formed by oxidizing the polysilicon, an operation of performing the high-density plasma deposition process is omitted, and the manufacturing cost is controllable.

(3) Cavities in the oxide layer and charge leakage caused by plasma bombardment are avoided.

(4) The density of unit cell is further reduced, the on-resistance is reduced, and the device efficiency is improved.

Figure 1:
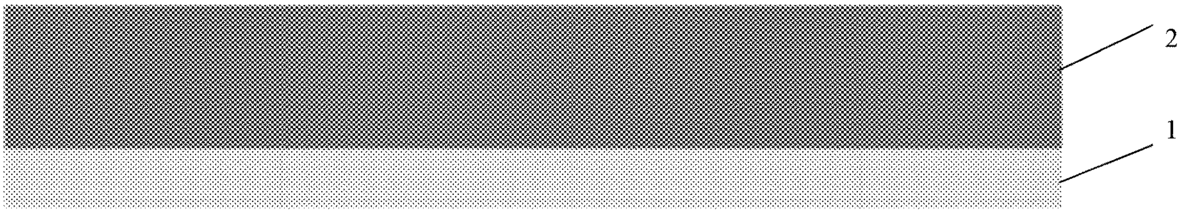
FIG. 1 is a schematic view of an operation A of the method of manufacturing a split gate power device according to one embodiment of the present disclosure.

Reference numerals in the drawings: 1, silicon substrate; 2, epitaxial layer; 3, mask; 4, gate trench; 5, source trench; 6, oxide pad layer; 7, silicon nitride film; 8, polysilicon for oxidation; 9, isolation layer of silicon oxide; 10, voltage support dielectric layer; 11, source polysilicon; 12, oxide layer between polysilicon layers; 13, gate polysilicon; 14, body region; 15, source region; 16, silicon dioxide dielectric layer; 17, contact hole of the source region; 18, contact hole of the source region trench; 19, contact hole of the gate-interconnection region; 20, ohmic contact region; 21, protection layer of the contact via; 22, tungsten plug; 23, aluminum-copper compound; 24, passivation layer; 25, gate trench pattern; 26, source trench pattern.

DETAILED DESCRIPTION

Technical solutions in embodiments of the present disclosure will be clearly and completely described below by referring to the accompanying drawings in the embodiments of the present disclosure. Apparently, the described embodiments show only a part of, but not all of, the embodiments of the present disclosure. All other embodiments, which are obtained by any ordinary skilled person in the art based on the embodiments in the present disclosure without making creative work, shall fall within the scope of the present disclosure.

In the present embodiment, a method of manufacturing a split gate power device specifically includes the following operations.

In an operation S1, as shown in FIG. 1, one or more epitaxial layers 2 are formed, by chemical vapor deposition, on an upper surface of a silicon substrate 1. Each of the one or more epitaxial layers 2 is doped with trivalent elements and pentavalent elements. Specifically, the one or more epitaxial layers 2 are growing on the silicon substrate 1 composed of silicon, and the one or more epitaxial layers 2 are growing by performing the chemical vapor deposition. The one or more epitaxial layers 2 can be doped with, according to polarity of the device, the trivalent element, such as boron, or the pentavalent elements which are selected from arsenic and phosphorus. In the present embodiment, the one or more epitaxial layers 2 are doped with the boron. According to an operating voltage, a thickness of the one or more epitaxial layers 2 may have micrometer-level variations or is configured as a multilayer structure.

Figure 2:
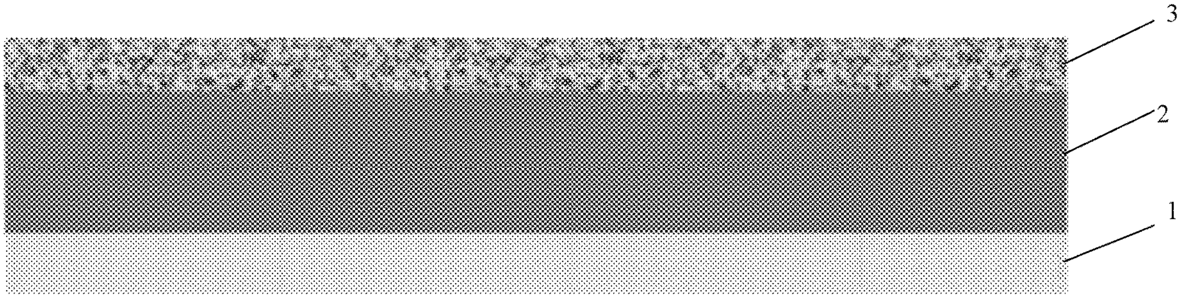
FIG. 2 is a schematic view of an operation B of the method of manufacturing the split gate power device according to one embodiment of the present disclosure.

In an operation S2, as shown in FIG. 2, a first mask 3 is deposited on an upper surface of the epitaxial layer 2. The first mask 3 formed is configured to form trenches. The first mask 3 may be photoresist or may be a multilayer structure of the photoresist combining with multi-layers of insulating masks, such as a structure of silicon dioxide-silicon nitride-silicon dioxide. The silicon dioxide and the silicon nitride are prepared by the chemical vapor deposition. The photoresist is spin-coated by performing a photolithography process. In the present embodiment, the first mask 3 is the multilayer structure of the photoresist combining with multi-layers of insulating masks.

Figure 3:
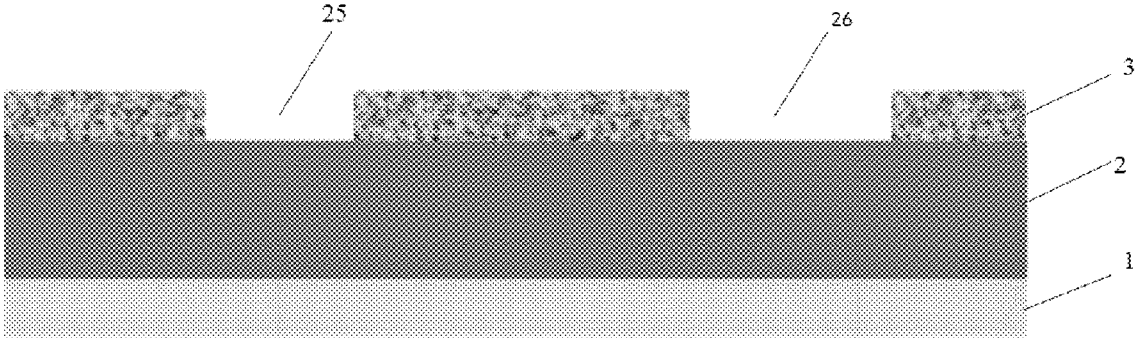
FIG. 3 is another schematic view of the operation B of the method of manufacturing the split gate power device according to one embodiment of the present disclosure.

In an operation S3, as shown in FIG. 3, a gate trench pattern 25 and a source trench pattern 26 are defined in the first mask 3 to obtain gate trenches 4 and source trenches 5. The gate trenches 4 include a unit cell gate trench and a gate-interconnection trench. The source trenches 5 include a unit cell source trench and a source-interconnection trench. The gate trenches 4 include two types of gate trenches, one type of the two types of gate trenches is configured for unit cell gates, and the other type of the two types of gate trenches is configured for gate interconnection. The gate trench pattern 25 and the source trench pattern 26 are exposed to the first mask 3 through a mask plate. When a lower portion of the first mask 3 is the multi-layers of insulating masks, the gate trench pattern 25 and the source trench pattern 26 are formed, by dry etching, on the multi-layers of insulating masks. A critical dimension of an interconnection trench (such as the gate-interconnection trench or the source-interconnection trench) is greater than a critical dimension of a unit cell trench (such as the unit cell source trench or the unit cell gate trench).

Figure 4:
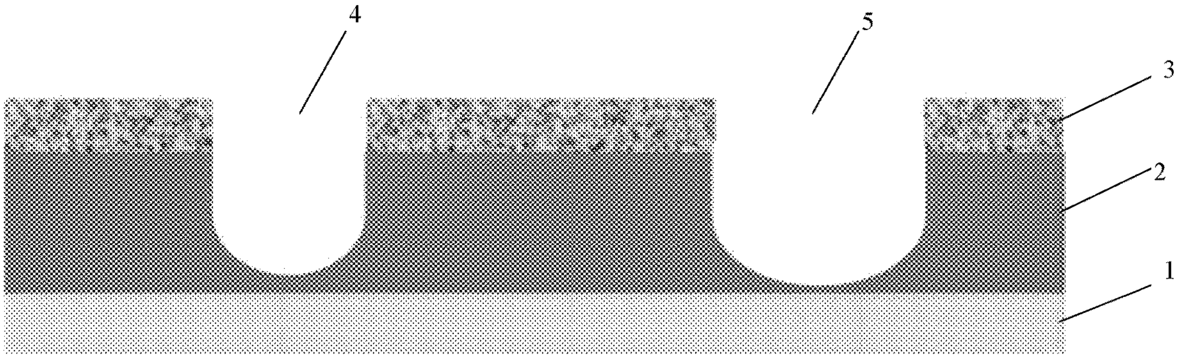
FIG. 4 is another schematic view of the operation B of the method of manufacturing the split gate power device according to one embodiment of the present disclosure.

In an operation S4, as shown in FIG. 4, after the gate trench pattern and the source trench pattern are formed on the first mask 3, the gate trench pattern and the source trench pattern are further formed on the one or more epitaxial layers 2 by performing the dry etching. Due to the nature of the dry etching, the source trenches 5, which have the greater critical dimension, are etched shallower, and the gate trench is etched more deeply.

Figure 5:
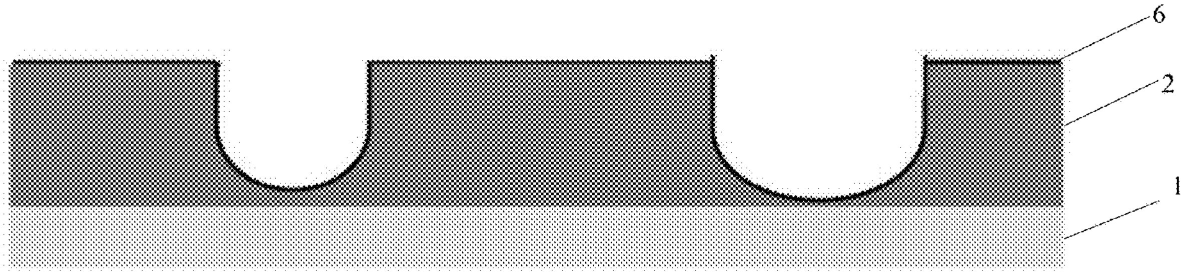
FIG. 5 is a schematic view of an operation C of the method of manufacturing the split gate power device according to one embodiment of the present disclosure.

In an operation S5, as shown in FIG. 5, the first mask 3 is removed by performing wet etching. A thermal oxidation process is performed to round gate-trench 4, and the source trench 5 and to repair damages caused by plasma. A layer of silicon oxide is growing on a side wall of each of the gate trench 4, and the source trench 5. The silicon oxide is processed by wet etching. Specifically, a thickness of the layer of silicon oxide is 50 nm. Further, a large portion of the layer of silicon oxide is removed by performing the wet etching, and about 20 nm of the layer of silicon oxide is left to serve as a pad layer 6 for a silicon nitride film that will be formed subsequently.

Figure 6:
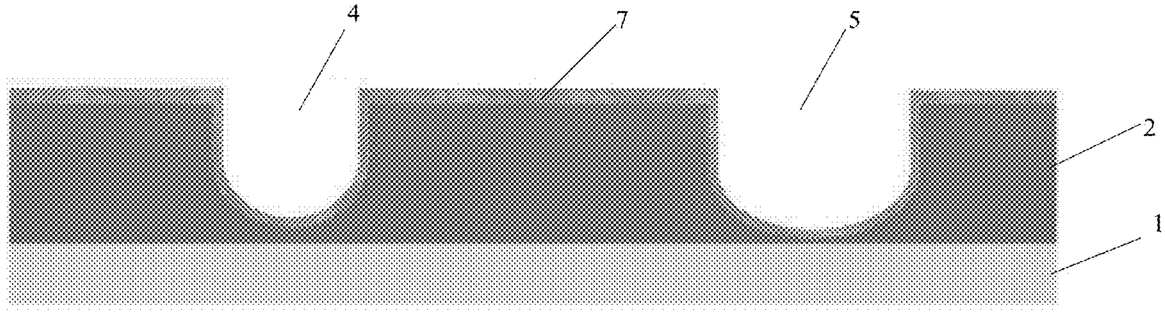
FIG. 6 is another schematic view of the operation C of the method of manufacturing the split gate power device according to one embodiment of the present disclosure.

In an operation S6, as shown in FIG. 6, the silicon nitride film 7 is growing on the pad layer 6 by performing an oxidization process and by performing low-pressure chemical vapor deposition. The silicon nitride film 7 covers a trench surface of each of the gate trenches and the source trenches disposed on the surface of the one or more entire epitaxial layers 2. Specifically, the pad layer 6 of silicon oxide and the silicon nitride film 7 cover the trench surface of each of the gate trenches and the source trenches disposed on the surface of the entire epitaxial layers 2.

Figure 7:
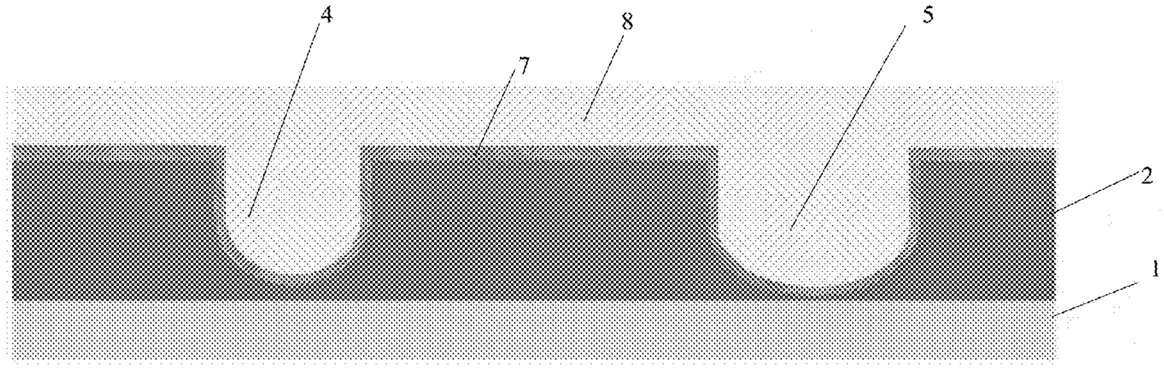
FIG. 7 is another schematic view of the operation C of the method of manufacturing the split gate power device according to one embodiment of the present disclosure.

In an operation S7, as shown in FIG. 7, a polysilicon 8 for oxidation is formed, by performing the low-pressure chemical vapor deposition, on the silicon nitride film 7, the polysilicon 8 having a thickness of 800 nm is deposited, such that an inside of each of the gate trenches and the source trenches is fully filled with the polysilicon 8, and a surface of the silicon nitride film 7 is covered by the polysilicon 8. The polysilicon is polysilicon for oxidation.

Figure 8:
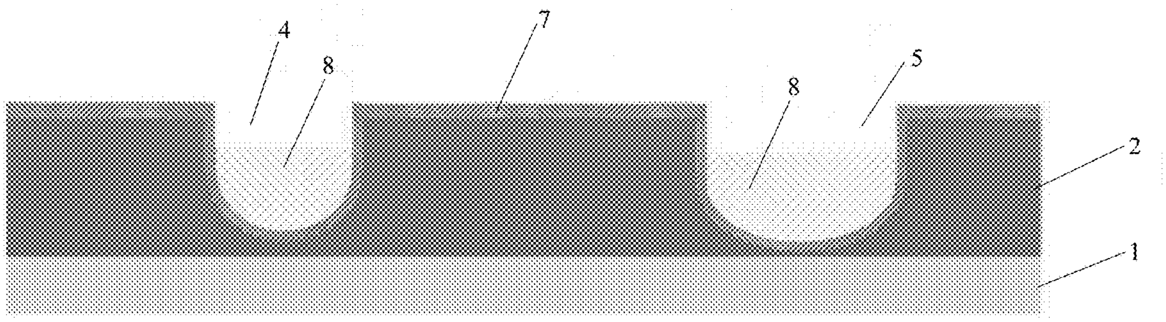
FIG. 8 is another schematic view of the operation C of the method of manufacturing the split gate power device according to one embodiment of the present disclosure.

In an operation S8, as shown in FIG. 8, the polysilicon 8 for oxidation, which is disposed on the surface of the silicon nitride film 7 and at an upper portion of the inside of each of the gate trenches and the source trenches, is removed by performing chemical mechanical grinding and plasma etching, such that the polysilicon 8 for oxidation is disposed only in a middle portion and a lower portion of each of the gate trenches and the source trenches.

Figure 9:
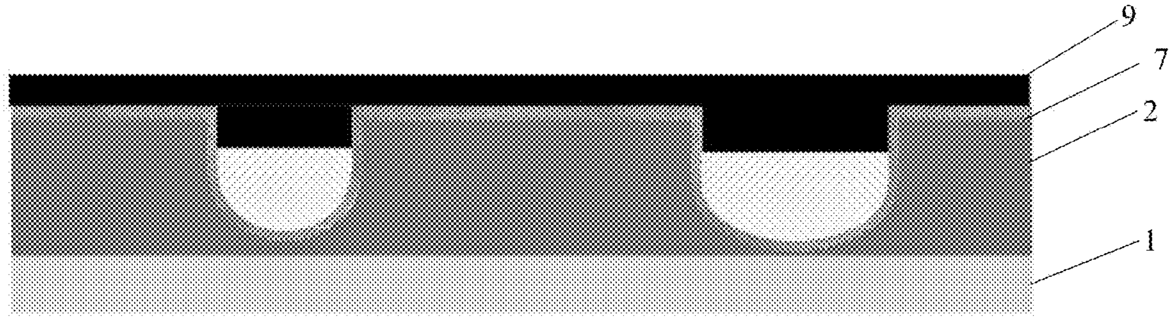
FIG. 9 is another schematic view of the operation C of the method of manufacturing the split gate power device according to one embodiment of the present disclosure.

In an operation S9, as shown in FIG. 9, an isolation layer of silicon oxide 9 is formed, by performing the chemical vapor deposition, on the surface of the silicon nitride film 7 and at the inside of each of the gate trenches and the source trenches. The isolation layer of silicon oxide 9 is to be served as an isolation layer when the polysilicon for oxidation is etched subsequently.

Figure 10:
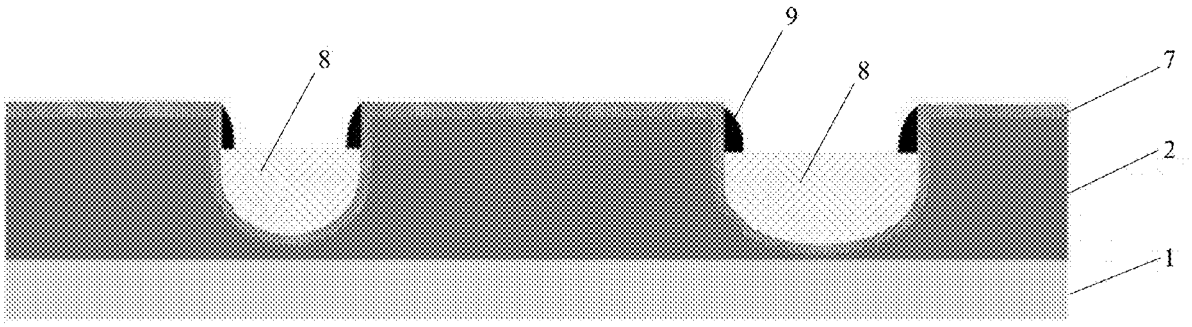
FIG. 10 is another schematic view of the operation C of the method of manufacturing the split gate power device according to one embodiment of the present disclosure.

In an operation S10, as shown in FIG. 10, the silicon oxide is etched by performing dry etching. Since the dry etching is non-directional, a portion of the silicon oxide 9 is retained on a trench side surface of each of the gate trenches and the source trenches to serve as the isolation layer 9 when the polysilicon is etched subsequently.

Figure 11:
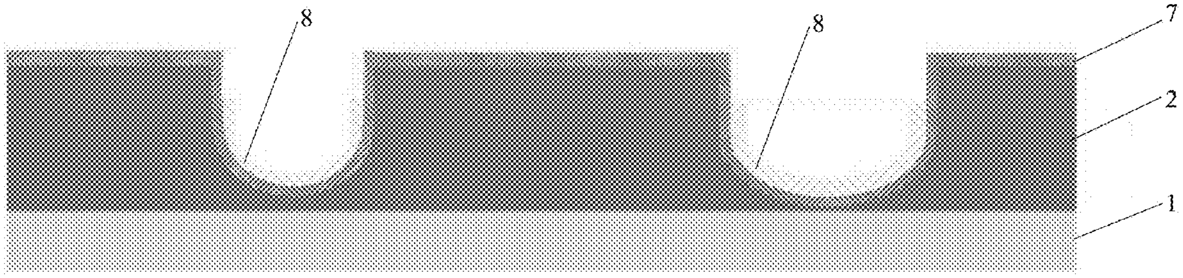
FIG. 11 is another schematic view of the operation C of the method of manufacturing the split gate power device according to one embodiment of the present disclosure.

In an operation S11, as in FIG. 11, the polysilicon 8 is dry etched. Since the isolation layer 9, which is disposed on the trench side surface of each of the gate trenches and the source trenches, blocks the dry etching, eventually a portion of the polysilicon 8 is retained on a trench surface of the middle portion and a trench surface of the lower portion of each of the gate trenches and the source trenches. A thickness of the retained polysilicon 8 is determined according to a thickness of the voltage support dielectric layer that is required. Subsequently, the retained isolation layer 9 is removed by performing wet etching.

Figure 12:
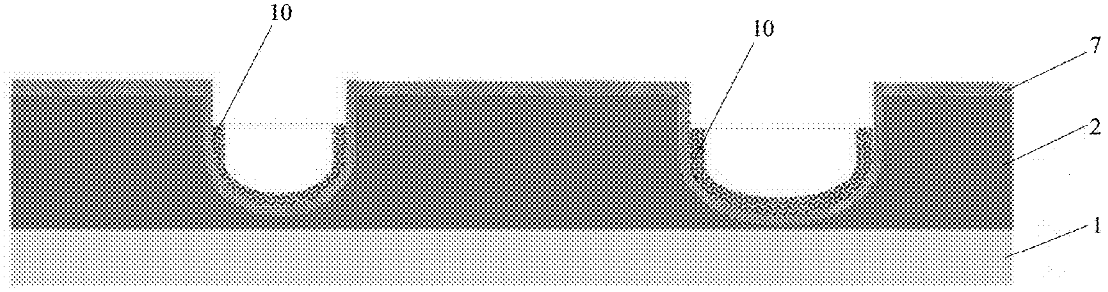
FIG. 12 is another schematic view of the operation C of the method of manufacturing the split gate power device according to one embodiment of the present disclosure.

In an operation S12, as in FIG. 12, the retained polysilicon 8 is converted into silicon oxide 9 by performing the thermal oxidation process. The surface of the one or more epitaxial layers 2 and the trench surface of the upper portion and the trench surface of the middle portion of each of the gate trenches and the source trenches are not oxidized due to being covered by the silicon nitride film 7. Therefore, critical dimensions of the upper portion and the middle portion of each of the gate trenches and the source trenches are not widened as those in the conventional split gate power device. The silicon nitride film 7 and the silicon oxide 9 disposed at the lower portion of each of the gate trenches and the source trenches serve as the voltage support dielectric layer 10.

Figure 13:
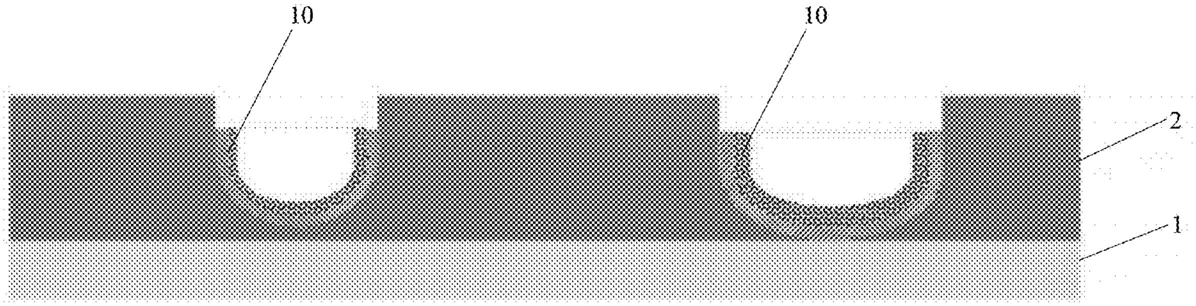
FIG. 13 is another schematic view of the operation C of the method of manufacturing the split gate power device according to one embodiment of the present disclosure.

In an operation S13, as in FIG. 13, the silicon nitride film 7 is removed by using hot phosphoric acid. Since the silicon nitride film 7 disposed at the lower portion of each of the gate trenches and the source trenches is covered by the silicon oxide 9, only the silicon nitride film 7, which is disposed on the surface of the one or more epitaxial layers 2 and at the upper portion of each of the gate trenches and the source trenches, is removed.

Figure 14:
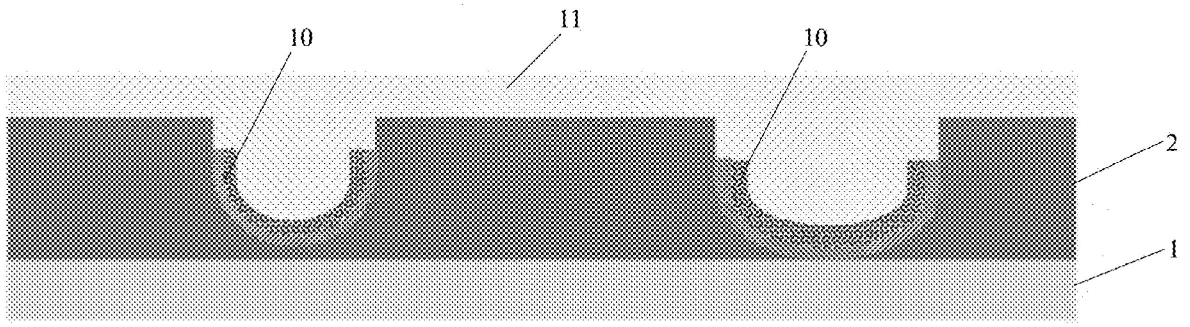
FIG. 14 is a schematic view of an operation D of the method of manufacturing the split gate power device according to one embodiment of the present disclosure.

In an operation S14, as shown in FIG. 14, a source polysilicon 11 is formed, by performing chemical vapor deposition, on the surface of the one or more epitaxial layers 2 and in the inside of each of the gate trenches and the source trenches. The polysilicon 11 having a thickness of 800 nm is deposited to fully fill the inside of each of the gate trenches and the source trenches and to cover the entire surface of the one or more epitaxial layers 2.

Figure 15:
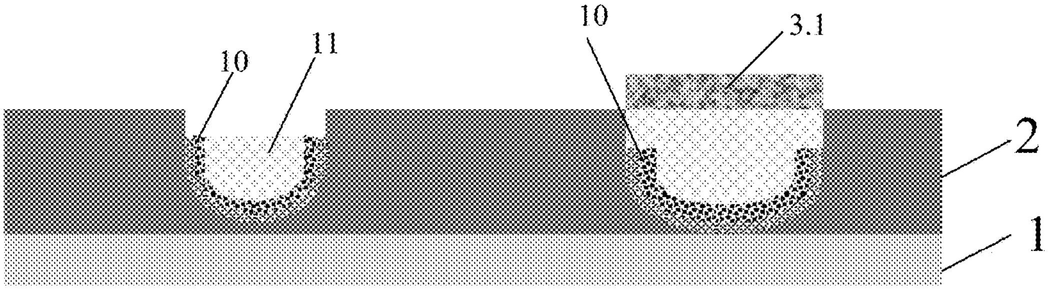
FIG. 15 is another schematic view of the operation D of the method of manufacturing the split gate power device according to one embodiment of the present disclosure.

In an operation S15, as shown in FIG. 15, the photoresist is coated, by performing the photolithography process, to form a second mask 3.1. A source-interconnection trench pattern is formed on the second mask 3.1. The source-interconnection trench pattern is formed by performing the photolithography process through the second mask 3.1 to expose the photoresist, and subsequently, the source polysilicon 11 is dry etched.

Figure 16:
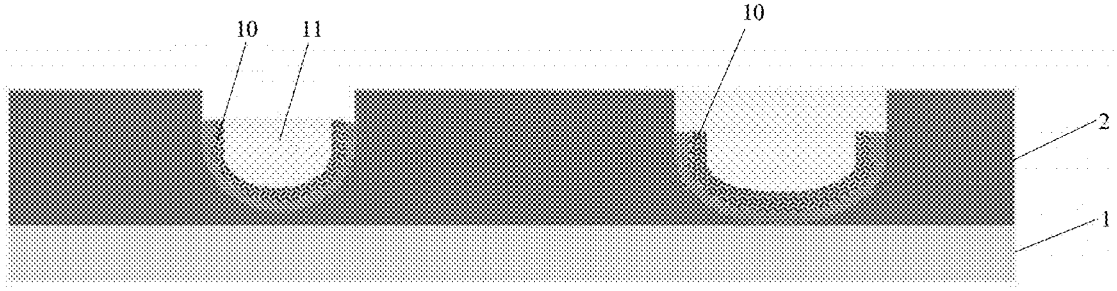
FIG. 16 is another schematic view of the operation D of the method of manufacturing the split gate power device according to one embodiment of the present disclosure.

In an operation S16, as in FIG. 16, any residual second mask 3.1 is removed by using hot sulfuric acid.

Figure 17:
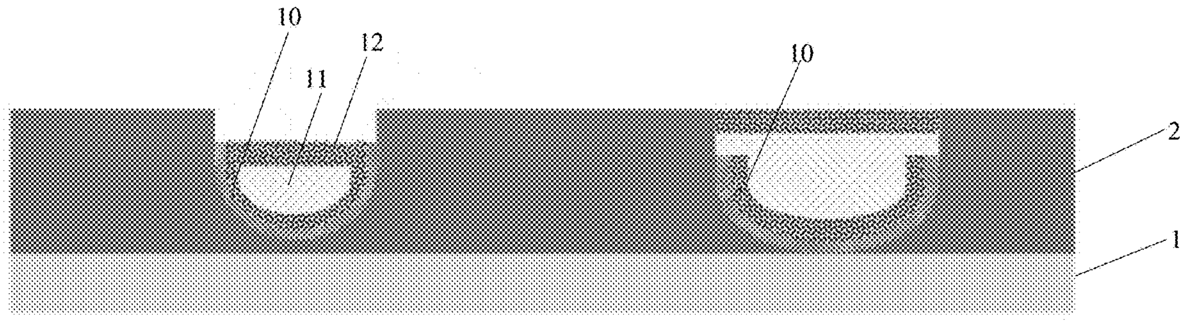
FIG. 17 is a schematic view of an operation E of the method of manufacturing the split gate power device according to one embodiment of the present disclosure.

In an operation S17, as in FIG. 17, another layer of silicon oxide is formed, by performing the thermal oxidation process, on a surface of the source polysilicon 11 to serve as an inter-polysilicon-layered oxide layer. A thickness of the inter-polysilicon-layered oxide layer 12 is determined based on the device and is in a range of 100 nm to 500 nm.

Figure 18:
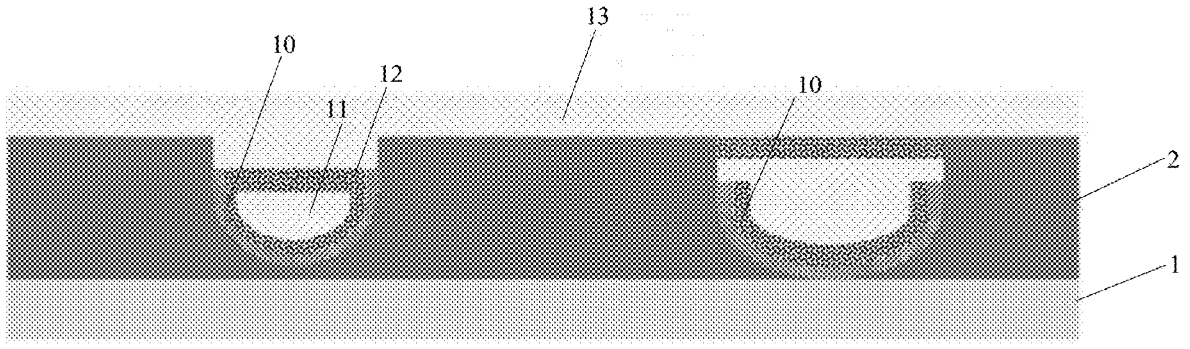
FIG. 18 is a schematic view of an operation F of the method of manufacturing the split gate power device according to one embodiment of the present disclosure.

In an operation S18, as in FIG. 18, a gate polysilicon 13 is formed by performing chemical vapor deposition. The gate polysilicon 13 having a thickness of 800 nm is deposited to fill the inside of each of the gate trenches and the source trenches and to cover the surface of the one or more epitaxial layers 2.

Figure 19:
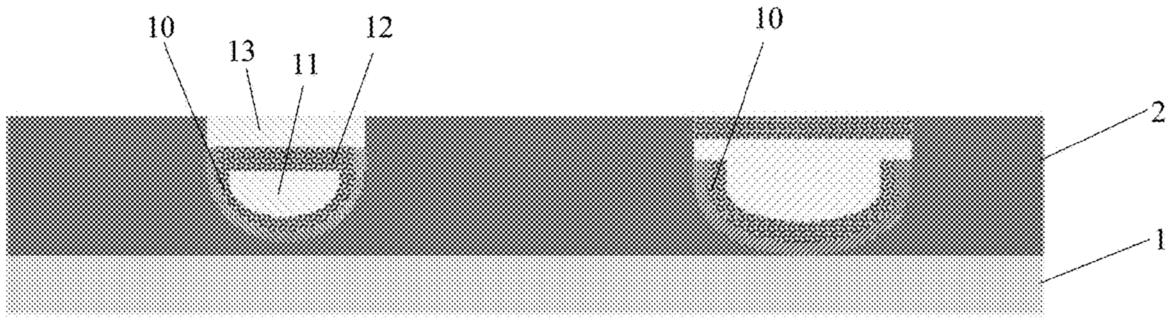
FIG. 19 is another schematic view of the operation F of the method of manufacturing the split gate power device according to one embodiment of the present disclosure.

In an operation S19, as in FIG. 19, the gate polysilicon 13, which is disposed on the surface of the one or more epitaxial layers 2 and received in the source trench 5, is removed by chemical mechanical grinding, and only the gate polysilicon 13 received in each of the gate trenches is retained. In addition, the silicon oxide 12, which is disposed on a surface of the source polysilicon 11 received in the source trench 5, is exposed.

Figure 20:
FIG. 20 is another schematic view of the operation F of the method of manufacturing the split gate power device according to one embodiment of the present disclosure.

In an operation S20, as in FIG. 20, the silicon oxide 12, which is disposed on the surface of the source polysilicon 11 received in the source trench 5, is completely removed by performing hydrofluoric-acid wet etching, such that the source polysilicon 11 received in the source trench 5 is exposed.

Figure 21:
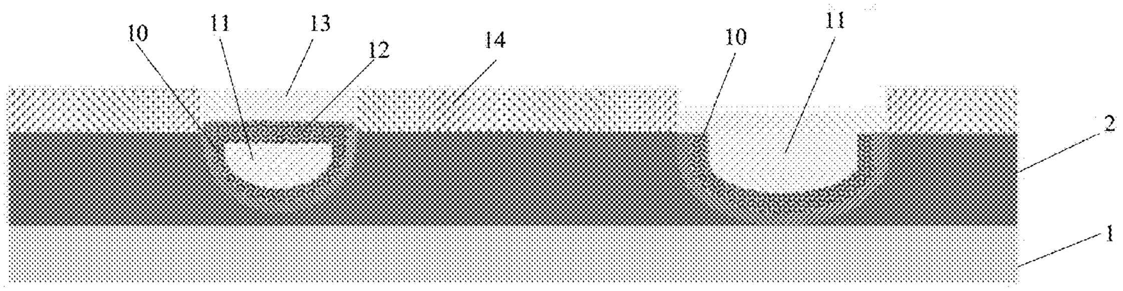
FIG. 21 is a schematic view of an operation G of the method of manufacturing the split gate power device according to one embodiment of the present disclosure.

In an operation S21, as in FIG. 21, a body region 14 is obtained by implanting first impurities into the upper surface of the one or more epitaxial layers, and subsequently, the first impurities in the body region 14 are activated by performing the thermal process. The first impurities include the trivalent elements or the pentavalent elements.

Figure 22:
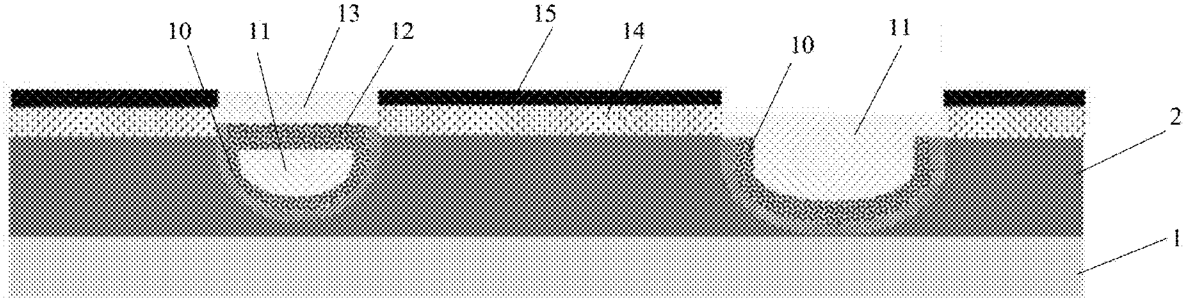
FIG. 22 is another schematic view of the operation G of the method of manufacturing the split gate power device according to one embodiment of the present disclosure.

In an operation S22, as in FIG. 22, a source region 15 is obtained by implanting second impurities into an upper surface of the body region 14. The implanted second impurities are pentavalent elements or trivalent elements. Lastly, a unit cell structure is obtained.

Figure 23:
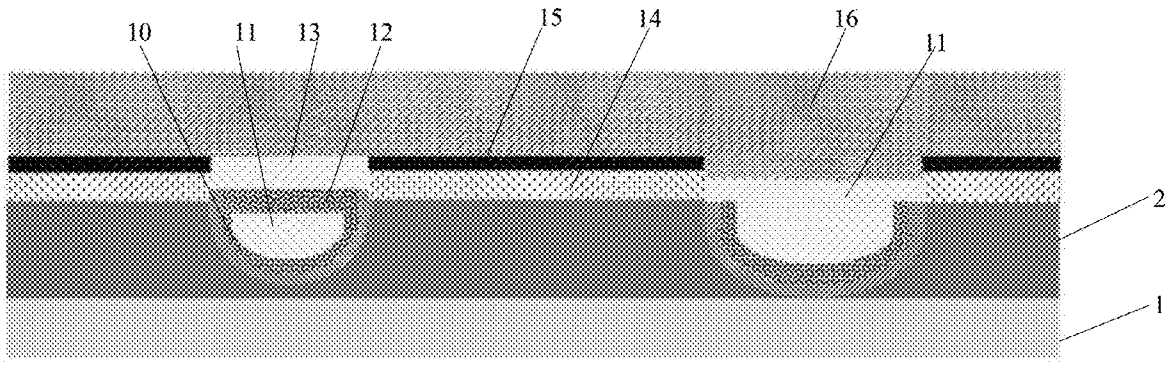
FIG. 23 is a schematic view of an operation H of the method of manufacturing the split gate power device according to one embodiment of the present disclosure.

In an operation S23, as in FIG. 23, a silicon dioxide dielectric layer 16 is formed by performing chemical vapor deposition.

Figure 24:
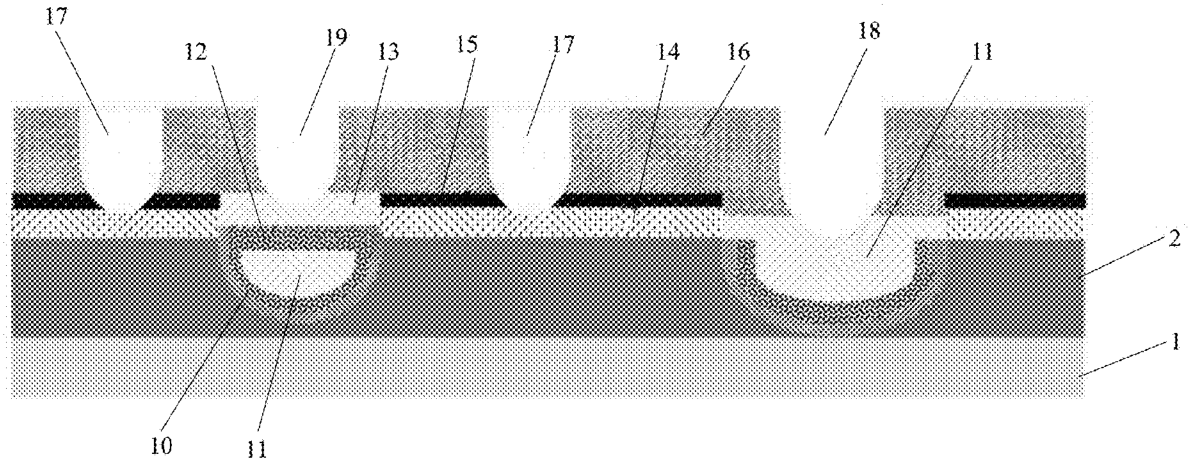
FIG. 24 is another schematic view of the operation H of the method of manufacturing the split gate power device according to one embodiment of the present disclosure.

In operations S24 and S25, as in FIG. 24, a contact hole pattern of the source region, a contact hole pattern of a source region trench, and a contact hole pattern of a gate region are defined by performing the photolithography process and using the photoresist. The contact holes 17 of the source region, the contact hole 18 of the source region trench, and the contact hole 19 of the gate region are formed by dry etching the silicon dioxide dielectric layer 16, the source region 15, the body region 14, and the source polysilicon 11. The contact holes 17 of the source region are located at the body region 14, the contact hole 18 of the source region trench is located above the source trench 5, and the contact hole 19 of the gate-interconnection region is disposed above the gate trench 4.

Figure 25:
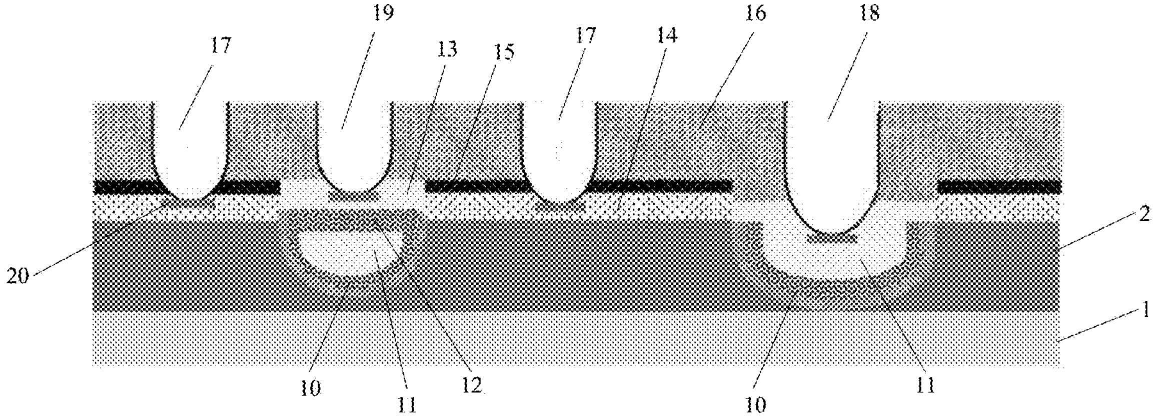
FIG. 25 is another schematic view of the operation H of the method of manufacturing the split gate power device according to one embodiment of the present disclosure.

In an operation S26, as in FIG. 25, highly-concentrated third impurities are implanted to be doped to a bottom of the contact hole of the trench of the body region (i.e., the contact holes 17 of the source region) to obtain an ohmic contact region 20 of the contact holes 17 of the trench of the source region. The third impurities are activated by performing rapid thermal annealing. Polarity of the third impurities in the operation S26 is opposite to polarity of the first impurities in the operation S21.

Figure 26:
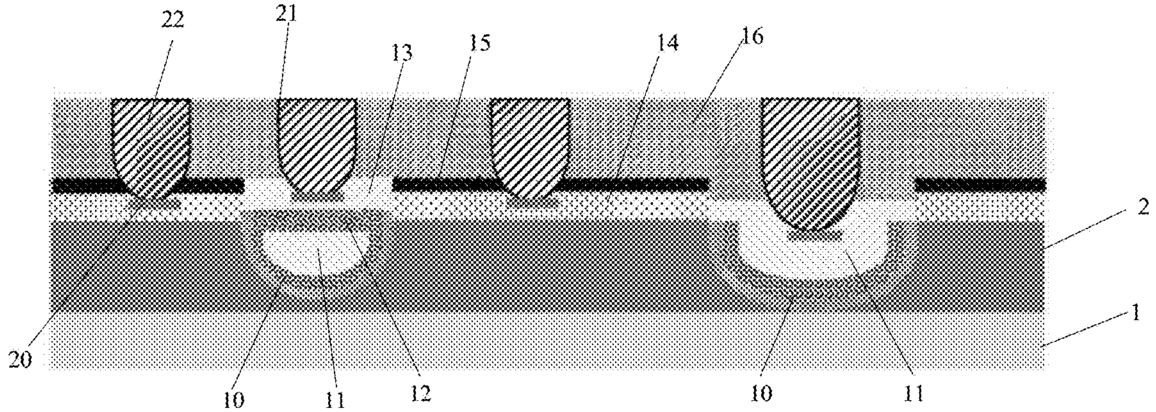
FIG. 26 is another schematic view of the operation H of the method of manufacturing the split gate power device according to one embodiment of the present disclosure.

In operations S27, S28, as in FIG. 26, metals and nitrides are deposited, by performing physical vapor deposition, to serve as a protection layer 21 of each contact. Silicides are formed by performing rapid thermal degradation. The metals include one or more of titanium, cobalt, and tantalum. The metal tungsten is deposited by performing a tungsten-bolt process, any metal tungsten disposed outside the contact holes 17 of the source region, the contact hole 18 of the source region trench, and the contact hole 19 of the gate-interconnection region is removed by performing dry etching, and a tungsten plug 22 is formed in each of the contact holes 17 of the source region, the contact hole 18 of the source region trench, and the contact hole 19 of the gate-interconnection region.

Figure 27:
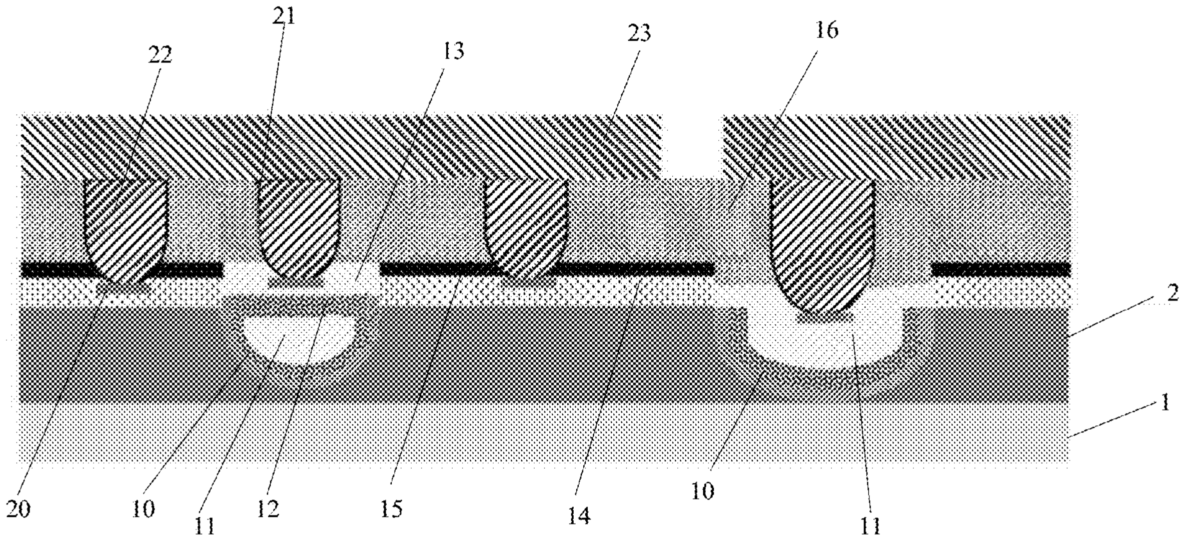
FIG. 27 is a schematic view of an operation I of the method of manufacturing the split gate power device according to one embodiment of the present disclosure.

In an operation S29, as in FIG. 27, an aluminum-copper compound 23 is formed, by performing physical vapor deposition, on the tungsten plug 22, and subsequently, a circuit is formed by performing the photolithographic process and dry etching.

Figure 28:
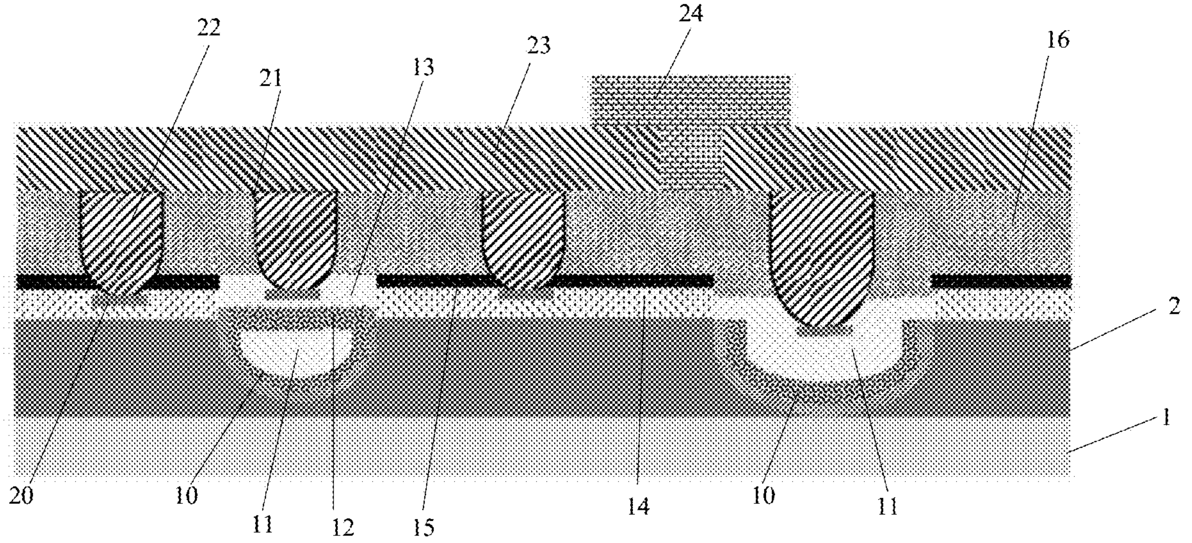
FIG. 28 is a schematic view of an operation J of the method of manufacturing the split gate power device according to one embodiment of the present disclosure.

In an operation S30, as in FIG. 28, a passivation layer 24 is deposited, and the passivation layer is etched by performing the lithography process. The passivation layer includes silicon nitride or silicon dioxide. Further, alloy annealing is performed.

The split gate power device is finally obtained. For the obtained split gate power device, the excessive wide line in the trench of the gate region, caused by the conventional method of manufacturing the split gate power device, is solved; the extent of quantity is improved, and consistency in threshold voltages of various unit cells is improved. Furthermore, the inter-polysilicon-layered oxide layer 12 is formed by oxidizing the polysilicon, an operation of high-density plasma deposition process is omitted. Manufacturing cost is controllable. Cavities in the oxide layer caused by the plasma bombardment and charge leakage are avoided.

The present disclosure is not limited to the details of the above embodiments, and any ordinary skilled person in the art can perform the present disclosure in other forms without departing from the spirit or essential features of the present disclosure. Therefore, in every point of view, the embodiments shall be regarded as exemplary and non-limiting. The scope of the present disclosure is limited by the appended claims and not by the foregoing description. Therefore, all variations falling within the meaning and the scope of the equivalent elements of the claims shall be covered by the present disclosure. Any appended markings in the claims shall not be regarded as limiting the claims.

In addition, it should be understood that although the specification is described in accordance with the embodiments, each embodiment does not include only one independent technical solution. The description of the specification is only for clarity. Any ordinary skilled person in the art shall take the specification as a whole, and the technical solutions in the embodiments can be combined appropriately to form other embodiments that can be understood by any ordinary skilled person in the art.

What is claimed is:

1. A method of manufacturing a split gate power device, comprising operations:

preparing one or more epitaxial layers, comprising: depositing, by performing chemical vapor deposition, one or more epitaxial layers on a surface of a silicon substrate, wherein each of the one or more epitaxial layers is doped with trivalent elements or pentavalent elements;

defining trenches;

preparing a voltage support dielectric layer at a bottom of each of the trenches;

preparing a source polysilicon;

growing an inter-polysilicon-layered silicon oxide;

preparing a gate polysilicon;

performing ion implantation to form a body region and a source region;

preparing contact holes and tungsten plugs;

preparing a passivation layer, comprising: depositing the passivation layer; etching the passivation layer by performing a lithography process; and performing an alloy annealing process, wherein the passivation layer comprises silicon nitride or silicon dioxide;

wherein the operation of defining the trenches comprises:

depositing a first mask on an upper surface of the one or more epitaxial layers, wherein the first mask is photoresist or a multilayer structure of the photoresist combining with multi-layers of insulating masks, the photoresist is spin-coated by performing a photolithography process;

defining a gate trench pattern and a source trench pattern on the first mask; wherein gate trenches to be formed from the gate trench pattern; source trenches to be formed from the source trench pattern; and forming, after the gate trench pattern and the source trench pattern being formed on the first mask, the gate trench pattern and the source trench pattern on the one or more epitaxial layers by performing dry etching;

wherein the operation of preparing the voltage dielectric support layer at the bottom of each of the trenches comprises:

removing, by performing wet etching, the first mask; performing thermal oxidation to round the gate trench pattern, and the source trench pattern and to repair damages caused by plasma; growing a layer of silicon oxide on a trench wall of each of the gate trench pattern, and the source trench pattern,; processing the silicon oxide by performing wet etching;

growing a pad layer by performing an oxidation process; growing a silicon nitride film on the pad layer by performing low-pressure chemical vapor deposition, wherein the silicon nitride film covers a trench surface of each of the gate trenches and the source trenches disposed on the entire surface of the one or more epitaxial layers;

depositing polysilicon for oxidation, by performing low-pressure chemical vapor deposition, to cover the surface of the silicon nitride film and to fully fill an inside of each of the gate trenches and the source trenches;

removing a portion of the polysilicon for oxidation, which is disposed on the surface of the silicon nitride film and at an upper portion of the inside of each of the gate trenches and the source trenches, by performing chemical mechanical grinding and plasma etching, leaving the rest portion of the polysilicon to be disposed at a lower portion and a middle portion of each of the gate trenches and the source trenches;

depositing, by performing chemical vapor deposition, silicon oxide on the surface of the silicon nitride film and the inside of each of the gate trenches and the source trenches;

dry etching the silicon oxide;

dry etching the polysilicon;

converting, by performing thermal oxidation, any polysilicon that is retained after the dry etching into silicon oxide, wherein the silicon nitride film and the silicon oxide disposed at the lower portion of each of the gate trenches and the source trenches serve as the voltage support dielectric layer; and removing the silicon nitride film by using hot phosphoric acid.

2. The method of manufacturing the split gate power device according to claim 1, wherein the operation of preparing the source polysilicon comprises:

forming, by performing chemical vapor deposition, the source polysilicon to on the surface of the one or more epitaxial layers and in the inside of each of the gate trenches and the source trenches;

coating, by performing a photolithographic process, photoresist to form a second mask; defining a source trench pattern on the second mask by performing the photolithography process through the mask to expose the photoresist; dry etching the source polysilicon;

removing any residual second mask by using hot sulfuric acid.

3. The method of manufacturing the split gate power device according to claim 2, wherein the operation of growing the inter-polysilicon-layered silicon oxide comprises:

forming, by performing a thermal oxidation process, another layer of silicon oxide on the surface of the source polysilicon to serve as the inter-polysilicon-layered oxide layer.

4. The method of manufacturing the split gate power device according to claim 3, wherein the operation of preparing the gate polysilicon comprises:

forming, by performing chemical vapor deposition, the gate polysilicon to fill the inside of each of the gate trenches and the source trenches and to cover the surface of the one or more epitaxial layers;

removing, by performing chemical mechanical grinding, the gate polysilicon that is disposed on the surface of the one or more epitaxial layers and received in the source trench, wherein only the gate polysilicon received in each of the gate trenches is retained, and the silicon oxide, which is disposed on a surface of the source polysilicon received in the source trench, is exposed;

completely removing, by performing hydrofluoric-acid wet etching, the silicon oxide that is disposed on the surface of the source polysilicon received in the source trench, wherein the source polysilicon received in the source trench is exposed.

5. The method of manufacturing the split gate power device according to claim 4, wherein the operation of performing the ion implantation to form the body region and the source region comprises:

implanting first impurities into the upper surface of the one or more epitaxial layers to obtain a body region; activating, by performing a thermal process, the first impurities in the body region, wherein he first impurities comprise trivalent elements or pentavalent elements;

implanting second impurities into an upper surface of the body region to obtain the source region, wherein the implanted second impurities are pentavalent elements or trivalent elements; and obtaining a unit cell.

6. A split gate power device, obtained by performing the method according to claim 1.

* * * * *